United States Patent
van Spengen (10) Patent No.: US 6,998,851 B2
(45) Date of Patent: Feb. 14, 2006

(54) APPARATUS AND METHOD FOR DETERMINING THE PERFORMANCE OF MICROMACHINED OR MICROELECTROMECHANICAL DEVICES (MEMS)

(75) Inventor: Willem Merlijn van Spengen, AS Weesp (NL)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 8 days.

(21) Appl. No.: 10/448,734

(22) Filed: May 29, 2003

(65) Prior Publication Data

US 2004/0070400 A1    Apr. 15, 2004

Related U.S. Application Data

(60) Provisional application No. 60/384,448, filed on May 29, 2002.

(30) Foreign Application Priority Data

Jul. 19, 2002    (EP) ................................. 02447137

(51) Int. Cl.
G01R 31/08    (2006.01)
(52) U.S. Cl. ..................................... 324/523
(58) Field of Classification Search ................ 324/676, 324/601, 522, 658, 661; 73/504.03, 1.37, 73/1.38, 1.39
See application file for complete search history.

(56) References Cited

U.S. PATENT DOCUMENTS

| | | | |
|---|---|---|---|
| 5,211,051 A | 5/1993 | Kaiser et al. ..................... 73/1 |
| 5,447,051 A * | 9/1995 | Hanks et al. ................. 73/1.15 |
| 5,506,454 A | 4/1996 | Hanzawa et al. ........... 307/10.1 |
| 5,659,262 A * | 8/1997 | Memishian ................. 327/307 |
| 6,629,448 B1 * | 10/2003 | Cvancara ..................... 73/1.38 |
| 2003/0200785 A1 * | 10/2003 | Platt ........................... 73/1.37 |

FOREIGN PATENT DOCUMENTS

| | | |
|---|---|---|
| EP | 0 639 755 A2 | 8/1994 |
| WO | WO 00/02110 | 1/2000 |
| WO | WO 02/01584 | 1/2002 |

OTHER PUBLICATIONS

Goldsmith, C., et al., *Lifetime Characterization of Capacitive RF Mems Switches*, 2001 IEEE MIT-S Digest (2001) pp. 227-230.

* cited by examiner

Primary Examiner—Anjan Deb
Assistant Examiner—John Teresinski
(74) Attorney, Agent, or Firm—Knobbe Martens Olson & Bear LLP (57) ABSTRACT

An apparatus for determining the performances of at least one micromachined or microelectromechanical device (MEMS device) intended to carry a high frequency signal having an intended working frequency is disclosed. The MEMS device comprises a capacitive structure with at least one movable part, able to move with a frequency. The apparatus comprises a voltage signal source, at least one voltage divider circuit arranged between the capacitive structure and the voltage signal source, and a detection unit for detecting and measuring the voltage at the outlet of the voltage divider. The detection unit provides a combined voltage signal of an actuation voltage able to act on the moveable part of the capacitive structure with an actuation frequency and of a measurement voltage having a measurement frequency lower than the intended working frequency.

39 Claims, 6 Drawing Sheets

APPARATUS AND METHOD FOR DETERMINING THE PERFORMANCE OF MICROMACHINED OR MICROELECTROMECHANICAL DEVICES (MEMS)

RELATED APPLICATIONS

This application claims priority under 35 U.S.C. § 119(e) from provisional application No. 60/384,448 filed May 29, 2002, which is hereby incorporated by reference.

BACKGROUND OF THE INVENTION

1. Field of the Invention

The present invention is related to an apparatus and a method for determining the performance of micromachined or microelectromechanical devices (MEMS) with movable parts that handle high frequency signals. More specifically the performance parameters related to the moving behavior of such movable devices are investigated. These movable devices are electromechanical movable devices such as MEMS switches, relays, varactors, tunable capacitors or similar.

2. Description of the Related Technology

Micromachined or microelectromechanical devices can be found in a large number of applications including sensors, actuators and transducers. An example of such a field of application is wireless communication, which is expanding at an incredible pace for applications ranging from mobile phones to satellite communications. "RF MEMS" technologies are central to many parts of this expansion. The term "RF MEMS devices" designated a variety of micromachined or MEMS devices such as tunable capacitors or microswitches used in these telecommunication circuits and as such these MEMS devices are operative in a given high frequency range. These RF-MEMS components are expected to be a solution to most of the off-chip components required by state of the art high frequency transmitter and receiver systems, like antenna switches, off-chip capacitors and filters, whether tunable or not. The electrical behavior, e.g. the capacitance value, the making of an electrical contact, of some of these "RF MEMS" devices can be tuned as these devices comprise a movable part. The ability to tune or to change the electrical characteristics of such micromachined device allows the development of reconfigurable circuits: one can alter the operating range or the selectivity of the electrical circuit by e.g. changing the capacitance value of the capacitors used in a filter, by e.g. selecting components by means of a switch. The moving action of the device can be controlled by means of an applied voltage resulting in an electrostatic force.

However before this "RF-MEMS" technology can be implemented into mainstream systems the lifetime, reliability and endurance of these movable electromechanical devices must be demonstrated. Parameters related to the switching or moving action of these MEMS devices are e.g. pull-in voltage, rise- and fall-time of the switching action, on-capacitance, off-capacitance, and drift in any of these parameters. Nowadays these devices are tested at their intended operation or signal frequency (the frequency of normal operation for which the device was designed) which can be as high as 100 GHz, thereby requiring the use of complex and expensive testing tools. These testing tools need calibration and a controlled test environment, which makes it difficult to determine the characteristics of the MEMS device over the full range of the military specifications (MILSPEC). Given such testing equipment only a limited number of RF MEMS devices, most often only one, can be tested simultaneously, making it impractical to collect the large number of data needed to establish a good statistics of the characteristics of the RF MEMS device under study. In "lifetime characterization of capacitive RF MEMS switches", published on pp 227–300 of the Proceedings of the May 2001 IEEE International Microwave Symposium held in Arizona, C. Goldsmith et Al. report on the testing of a capacitive coupled RF MEMS switch with a lifetime of 5 $10^8$ cycles. The authors use a dual-pulse actuation voltage to reduce the high voltage portion of the actuation signal and a 10 GHz continuous wave, representative for a realistic signal wave as present during operation of the device. This 10 GHz signal is being multiplexed with this dual-pulse actuation voltage. The results were obtained by testing one-by-one the devices at the intended working frequency. The measurements were hence expensive and time-consuming and statistically relevant lifetime distribution cannot be obtained given the limited number of devices tested.

Accordingly, there is a need for the development of cheap lifetime testing equipment, which allows a time-efficient and statistical relevant measurement of the lifetime distribution of high frequency micromachined devices, such a solution would have a large commercial value.

In U.S. Pat. No. 5,506,454 an apparatus for self-diagnosing the characteristics of an acceleration sensor used in for instance the automotive industry, and a method for the diagnosis thereof are disclosed. The self-test comprises the application of a force corresponding to a predetermined acceleration of a mass part, by applying a corresponding signal for diagnosis to the acceleration sensor. The application of this force and thus corresponding signal for diagnosis can simulate the normal working of the device during acceleration, while the device is further left under normal operation conditions. No problem is mentioned related to the testing of high frequency micromachined devices. Commercial accelerometers carry signals of typically 1 to 50 kHz.

SUMMARY OF CERTAIN INVENTIVE ASPECTS OF THE INVENTION

One aspect of the invention provides an apparatus and a method which do not have the drawbacks of the state of the art, for determining the performances and in particular for testing the lifetime properties of micromachined or microelectromechanical devices (MEMS) comprising at least one movable part or element. In particular, the movable part which can be a capacitor or a switch which is operative at a frequency above 100 MHz.

Another aspect of the invention is to considerably shorten the time needed to establish a statistical significant dataset to determine the lifetime or reliability behavior of such high frequency MEMS devices.

Another aspect of the invention is to allow the use of standard testing equipment for testing such high frequency MEMS devices, as such standard testing equipment operating at room conditions, such as temperature and humidity, without the need for extensive calibration.

Another aspect of the invention is to enable the parallel or simultaneous measurement of multiple high frequency MEMS devices under test.

Another aspect of the invention is to enable testing of such high frequency MEMS devices in a broad range of environmental conditions e.g. at an elevated temperature and/or at high humidity levels.

In one aspect of the invention, an apparatus for determining switching characteristics of at least one high frequency MEMS device is disclosed. This high frequency device comprises a capacitive structure with at least two parts relative movable towards each other. The apparatus comprises supply means for generating a combined voltage comprising an actuation voltage for varying the relative position of these at least two movable parts and a measurement voltage, means for providing this combined voltage signal to this at least one high frequency MEMS device. The apparatus further comprises at least one voltage divider circuit capable of receiving this at least one high frequency MEMS device and the combined voltage is applied to this voltage divider circuit resulting in an amplitude modulation of the measurement voltage by varying the relative position of these at least two movable parts.

In this aspect of the invention, the apparatus further comprises means for detecting the envelope of the amplitude modulated measurement voltage.

In this aspect of the invention, the apparatus further comprises means for digitally selecting this at least one voltage divider circuit from an array of voltage divider circuits. This digitally selecting means includes means for selecting at least two of the voltage divider circuits simultaneously from the array of voltage divider circuits.

In another aspect of the invention, a method is disclosed for determining switching characteristics of at least one high frequency MEMS device. In operation this MEMS device transmits or conducts a high frequency signal having a signal frequency above 100 MHz or even above 1 GHz, up to 100 GHz and even more. This high frequency (HF) MEMS device comprises a capacitive structure with at least two parts relative movable towards each other and this high frequency MEMS device is arranged in a voltage divider. The method comprises applying a combined voltage signal to this HF MEMS device, whereby this combined voltage comprises an actuation voltage for varying the relative position of these at least two movable parts, whereby the actuation voltage has an actuation frequency below the signal frequency and a measurement voltage. The HF MEMS device is arranged in this voltage divider such that the variation of the relative position of these at least two movable parts results in an amplitude modulation of the measurement voltage In this aspect of the invention, the relative position of the at least two movable parts is varied between two predetermined values. The envelope of the amplitude modulated measurement voltage has two extreme values. Each of these two extreme values respectively corresponds to one of these two predetermined relative positions, and the difference between these two values of the envelope is indicative for switching characteristics of the high frequency MEMS device. Alternatively each of these two extreme values respectively corresponds to one of these two predetermined relative positions, and the time required to vary the value of the envelope between these two extreme values is indicative for switching characteristics of the high frequency MEMS device.

In one embodiment, the high frequency MEMS device is an RF MEMS switch transmitting or carrying a signal having a signal frequency in the range of 100 MHZ to 100 GHz, preferably up to about 10 GHz. In one embodiment, the frequency of the actuation voltage is in the range of 1 Hz to 200 kHz, and embodiments may have a frequency selected from one of the following subranges: 1 Hz to 10 Hz, 1 Hz to 1 kHz, 1 Hz to 200 kHz, 10 Hz to 1 kHz, 10 Hz to 200 kHz, or 1 kHz to 200 kHz. In another embodiment, the frequency of the actuation voltage is in the range of 1 Hz to 40 kHz and preferably in the range of 1 kHz to 40 kHz. In one embodiment, the measurement voltage has a frequency in the range of 1 MHz to 50 MHz, and embodiments may have a frequency selected from one of the following subranges: 1 MHz to 10 MHz, 1 MHz to 50 MHz, or 10 MHz to 50 MHz.

In another embodiment, the methods further comprise digitally selecting the high frequency MEMS device from an array of high frequency MEMS devices. Instead of selecting only one high frequency MEMS device at the time, more than one high frequency devices can be selected and measured in parallel.

In another aspect of the invention, an apparatus is disclosed for determining the performances of at least one micromachined or microelectromechanical device (MEMS device) intended to carry a high frequency signal having an intended working frequency, the device comprising a capacitive structure with at least one movable part, the apparatus comprising at least the following: means for providing a voltage signal, at least one voltage divider circuit comprising, in series with the means for providing the voltage signal, an impedance, an outlet and the capacitive structure, means for detecting and measuring the voltage at the outlet of the voltage divider, characterized in that the means for providing the voltage signal is arranged for providing a combined voltage signal of an actuation voltage able to act on the moveable part of the capacitive structure with an actuation frequency and of a measurement voltage, the measurement voltage having a measurement frequency lower than the intended working frequency. The intended working frequency is a frequency of an intended signal that will be carried.

In another aspect of the invention, the apparatus concerns the exchange of an ultra-high signal frequency (intended working frequency) with a lower one (measurement frequency) to measure the device properties without having to resort to the expensive and complex equipment to do measurements in the ultra high frequency range (1–100 GHz) range.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF CERTAIN EMBODIMENTS OF THE INVENTION

In relation to the appended drawings the present invention is described in detail in the sequel. While the below description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the below description. All variations coming within the meaning and range of equivalency of the claims are embraced within their scope.

Figure 1:
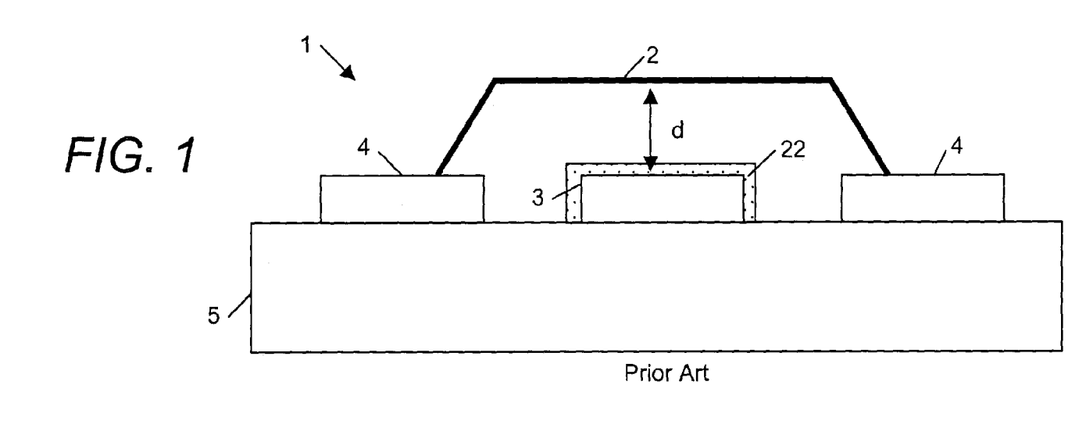
FIG. 1 illustrates a schematic view of a prior art RF MEMS switch as an example of a micromachined device with at least one movable part.

A schematic cross-sectional view of a RF MEMS switch (1) is given in FIG. 1. Examples of such capacitive microelectromechanical switches can be found in WO 02/01584 A1, hereby incorporated by reference in its entirety. In such FIG. 1 an example of a micromachined device is described. Such device (1) has at least one movable part which comprises a first element (2) and a second element (3). Both elements can move relative to each other: the first element (2) can be e.g. a membrane or a cantilever that is movable while the second element (3) is a reference element that is either fixed or movable. The fixed element (3) can be part of the substrate (5) on or in which the micromachined device (1) is formed. Each of both elements (2,3) can be considered as being one of the two electrodes of a capacitor so both elements are capacitively coupled. If each (2,3) of both elements comprise at least one conductive layer the capacitance between both elements (2,3) can be determined. Typically the relative movement of both elements results from an electrostatic force generated by a voltage applied between both elements, each comprising a conductive layer. For the purpose of teaching the invention an RF MEMS switch is used as an example of such a micromachined device (1) comprising at least one movable part which in operation transmits a high frequency signal, while the RF MEMS switch switches at a given frequency. The scope of the invention is however not limited to a RF MEMS switch only, but includes all micromachined devices with movable parts electrically operating at high frequencies. Other capacitive structures comprise e.g. a single movable plate (2) positioned in between two fixed plates (3) to which the single movable plate (2) is capacitively coupled. With high frequencies is meant, within the scope of this invention, frequencies above the 100 Mhz, preferably above 1 GHz.

According to one embodiment, the first element (2) is a bridge, typically made of a metal, positioned above the second element (3) which is in this example the signal line (3) situated in between the ground lines (4) of a coplanar wave guide (CPW). The switch is formed on a substrate (5), which is typically a glass, a high-resistive silicon substrate or quartz plate. In this example the conductive signal line (3) is covered with a dielectric (22) to avoid an ohmic contact between the conductive bridge (2) and the conductive signal line being the bottom electrode (3) of the associated capacitive structure. Such switch is also known as a Metal-Insulator-Metal switch (MIM) or capacitively coupled switch. In normal operation a high frequency signal will be carried along the signal path (3) as long as the switch is open, which in FIG. 2 would be the up position. If however the bridge (2) is pulled down, which in FIG. 2 would be the down position, the signal travelling or carried along the signal path (3) will be short-circuited to ground because the signal line (3) is, in this position of the bridge (2), strongly capacitively coupled, via the bridge (2), to the ground lines (4) of the coplanar wave guide shown in FIG. 2. When electro statically activating the bridge (2) with a high voltage signal having a given switching frequency the signal path of the high frequency data signal can be interrupted.

In one first aspect of the invention a method is disclosed to measure the switching characteristics of the micromachined device with a movable part under test.

Figure 2A:
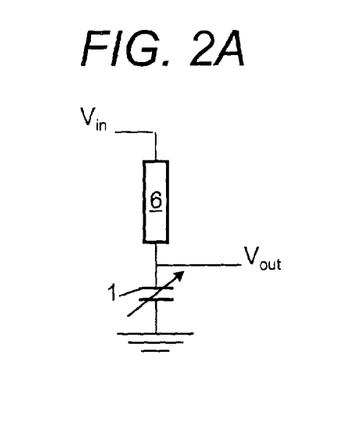
FIGS. 2a–2d illustrate schematic views of the device under test according to one aspect of the present invention.

A schematic view of the measurement set-up comprising the RF MEMS switch (1) under test is given in FIG. 2a. The RF MEMS switch (1) is part of a voltage divider comprising an impedance that remains constant during the measurement or is even frequency-independent, e.g. a resistor (6) having an impedance $Z_r$, and wherein the RF MEMS switch (1) acts as an impedance, variable during the measurement, having an impedance $Z_c$. The output voltage $V_{out}$ measured across the RF MEMS switch (1) is related to the input voltage $V_{in}$ applied to the voltage divider, as follows:

$$V_{out} = V_{in}\frac{Z_c}{Z_r + Z_c} \text{ whereby } Z_c = \frac{d}{2\pi f_{meas} A \varepsilon}$$

Figure 2B:
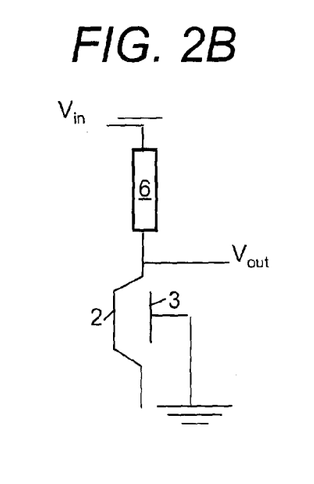
Figure 2C:
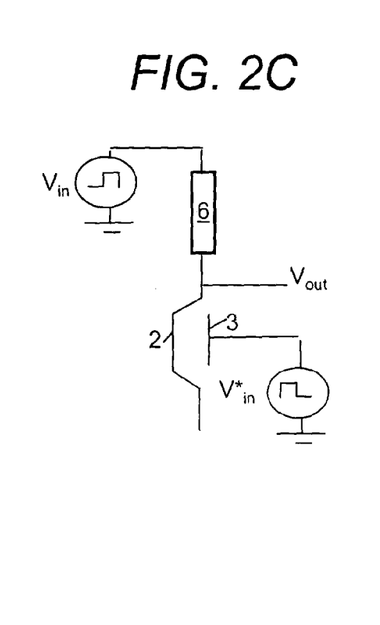
Figure 2D:
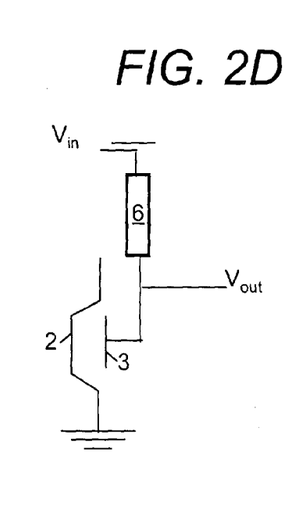

In this expression A is the area of the capacitance between the first (2) and second (3) elements of the RF MEMS switch (1), $\varepsilon$ is the dielectric constant of the medium in between the first (2) and second (3) element. If the switch (1) is open, the distance d between the bridge (2) and the signal line (3) has its maximum value and correspondingly the impedance $Z_c$ has it highest value. Hence the output voltage $V_{out}$, is a large fraction of the input voltage $V_{in}$. If the RF MEMS switch (1) is actuated the bridge (2) approaches the signal line (3) and hence the distance d is lowered. The impedance $Z_c$ decreases and the output voltage $V_{out}$ becomes a smaller fraction of the input voltage $V_{in}$. FIG. 2b shows a connection of the RF MEMS switch. The bridge (2) is connected to the resistor (6) at least at one terminal. The other terminal can be left floating or connected to the resistor (6) as well. The bottom electrode (3), being the signal line as illustrated in FIG. 1, is connected to a fixed voltage, in this example the ground. The bottom electrode (3) can be connected to a variable voltage source $V^*_{in}$, as shown in FIG. 2c. FIG. 2d shows an alternative set-up which is used in one embodiment wherein the bridge (2) is connect to ground or to a fixed voltage, while the bottom electrode (3), being the signal line, is connected to the resistor (6). The input voltage $V_{in}$ is applied to the signal line (3), which is connected in series with the impedance (6). The output voltage $V_{out}$ is taken from this signal line (3) at a position between the impedance (6) and the RF MEMS switch (1). Once could say that the input voltage $V_{in}$ travels along the signal path.

Figure 3A:
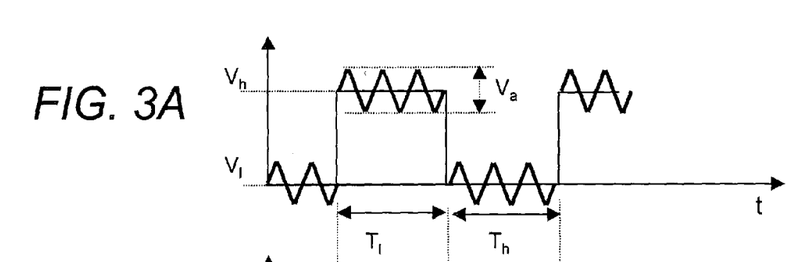
FIGS. 3a–3d illustrate the characteristics of an example of the voltage signals (V) used or generated according to another aspect of the invention as function of time t (s): input signal (FIG. 3a), output signal (FIG. 3b), filtered output signal (FIG. 3c), envelope signal (FIG. 3d).

The input voltage $V_{in}$ comprises two signals as shown in FIG. 3a: a first voltage signal $V_{act}$ (thin line) actuating the moving part, i.e. the switch (2), and a second voltage signal $V_{meas}$ (thicker line) used to detect the switching characteristics of the RF MEMS switch (1).

The first voltage signal is typically at a first, lower, frequency such that at this actuation frequency of the first voltage signal the variable impedance of the RF MEMS switch (1) is considered as an open circuit. The first voltage signal can be any periodic signal whose amplitude varies between a first low level $V_l$ and a first high level $V_h$. The first low level $V_l$ is below the actuation voltage of the switch and it brings the switch in a first position. Typically this first low level $V_l$ is 0 V. The first high level $V_h$ is situated above the actuation voltage of the device under study and forces the switch to a second position. In this example the first position is the up-position of the bridge (2) while the second position is the down-position where the bridge (2) touches the bottom electrode (3). The duty cycle of the actuation voltage, i.e. the ratio between the downtime and the sum of downtime and uptime, depends on the application the MEMS device is intended for. In case a single pulse is to be examined, then the duty cycle is very low, while for periodic signals the associated uptime $T_h$ and downtime $T_l$ of the switch are substantially of the same value. The downtime is typically higher than the sum of risetime and falltime of the actuation voltage. One example of such first voltage signal is a block wave, square wave or single pulse wave, with a duty cycle of about 50%. The frequency of the first voltage signal is in the range of 1 kHz to 200 kHz, preferably in the range of 1 kHz to 100 kHz, more preferably in the range of 1 kHz to 40 kHz. The frequency of the first signal can be kept constant during the measurement period but can be changed, e.g. be increased or decreased with a given factor. As shown in FIG. 2c the first input signal can be the combination of the input signal $V_{in}$ and an input signal $V^*_{in}$ of the opposite sign. This has the advantage that the absolute value of both signals $V_{in}$ and $V^*_{in}$ can be kept limited while the amplitude of their sum $(V_{in}+V^*_{in})$ exceeds the actuation voltage of the switch.

The second voltage signal is a signal at a second frequency, which is high compared to the frequency of the actuation voltage. In one embodiment, this second frequency, also called measurement frequency, is high enough in order to obtain a low enough value of the variable impedance (1) as the impedance of the RF MEMS device decreases with frequency. In one embodiment, if the second frequency is too low the associated impedance of the RF MEMS device (1) is high and correspondingly a high value of the resistor (6) is selected: consequently a high impedance network is created which would make the detection of the output signal difficult. In another embodiment, the frequency of the second voltage signal is chosen such that the difference in the capacitance between the "on" or "down" and the "off" or "up" position of the MEMS RF switch (1) results in a measurable change in amplitude of the high frequency component of the output signal. In another embodiment, the second frequency is high enough to be able to detect the variation in slope of the envelope signal indicative of the switching characteristics, as explained further on. Typically the frequency of the second voltage signal is 100 times higher than the frequency of the first voltage signal.

In another embodiment, this second frequency is substantially below the signal frequency of the signals passing through or transmitted by the RF MEMS switch (1) during operation. This signal frequency depends on the application for with the micromachined device is used, but in case of RF MEMS switches (1) this signal frequency is higher than 100 MHz and can range from 1 GHz to 100 GHz or higher. The frequency of the second voltage signal, i.e. the measurement frequency, is typically between 1 MHz and 50 MHz, preferably between 10 and 20 MHz. In another embodiment, this measurement frequency is sufficient for detecting the main features of the switch cycle such as pull-in voltage, rise- and fall-time of the switching action, on-capacitance, off-capacitance, and drift, i.e. variation in time or with number of switching cycles, in any of these parameters so as to study the degradation mechanisms and to detect a complete failure of the RF MEMS switch (1). The second voltage is preferably a periodic signal, such as a (co)sinusoidal, triangular wave, saw tooth wave or alike. In one embodiment, the amplitude $V_a$ of the second voltage signal is large enough to be detectable but not too large as to influence the up or down state of the RF MEMS switch (1). Typically the amplitude $V_a$ is in the range from 100 mV to 2V.

Figure 3B:
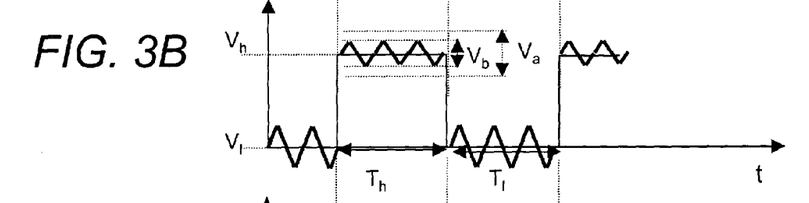

When the switch is actuated by the first voltage signal $V_{act}$ the impedance of the RF MEMS switch (1) will vary. The amplitude of the second voltage $V_{meas}$ will be varied also by the operation of the voltage divider. As shown in FIG. 3b the output voltage $V_{out}$ also comprises two signals: a low frequency signal corresponding to the actuation voltage $V_{act}$ (thin line) which is essentially unaffected and an amplitude modulated measurement voltage $V^*_{meas}$ (thick line) whose amplitude is e.g. being affected during the down time $T_l$ i.e. when the switch is closed. As shown in FIG. 3b the amplitude of the modulated second voltage signal $V^*_{meas}$ is lowered from the value $V_a$ when the bridge (2) is at maximum distance from the bottom electrode (3) to a value $V_b$. In normal operation the high frequency or RF signal is short-circuited to the ground when the switch is in its down-position. Apart from the absence of a high frequency signal no information of the switching characteristics is obtained during this down time as the RF signal is blocked. In the present invention the amplitude modulation of the modulated second voltage signal $V^*_{meas}$ due the relative displacement of the movable part in both the up and down time of the switch is used to study the switching characteristics of the device as function of number of switching cycles or movements.

Figures 3C, 3D:
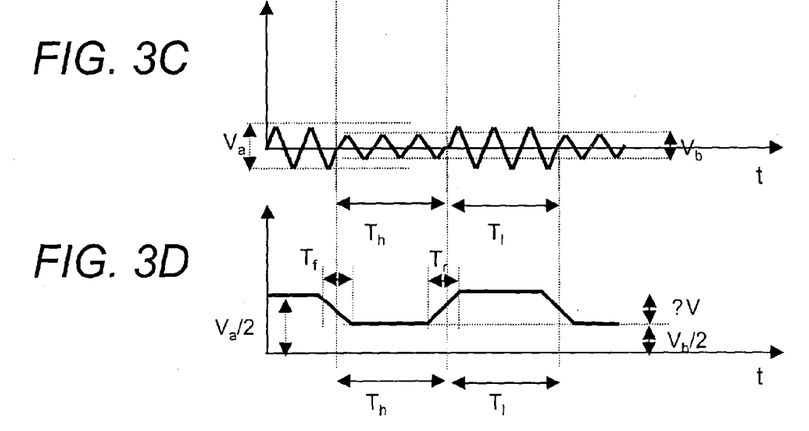

In an embodiment of the invention only the amplitude modulated part $V^*_{meas}$ or high frequency part of the output signal is considered. As shown in FIG. 3c the low frequency first signal voltage is removed from the output signal leaving only the modulated second voltage signal $V^*_{meas}$. In another aspect of the invention various alternatives to perform this filtering are presented. Further processing of the filtered output signal is done to yield an electrical signal $V_{dem}$ indicative to the switching characteristics of the RF MEMS switch (1), where "dem" represents "demodulation." From this signal one can determine e.g. if the switching action is ongoing or if the device failed shows no amplitude modulation. As explained in the aspect of the invention the envelope of the modulated second voltage signal $V^*_{meas}$ contains information regarding the switching performance of the RF MEMS switch (1). FIG. 3d shows this envelope signal $V_{dem}$ after filtering and demodulation the output signal. The value of the amplitude of the envelope signal varies between half the value of the amplitudes $V_a$ and $V_b$ of the modulated second voltage signal $V^*_{meas}$ in the corresponding up $(T_h)$ and down $(T_l)$ time of the switch. Because the change from one position to a second position takes a definite amount of time the envelope signal is characterized by a fall time $T_f$ when the switch is being pulled down by the actuation voltage and by a rise time $T_r$ when the switch is being released. From the difference in amplitude $(\Delta V)$ between the up and down position the change in capacitance of the RF MEMS switch (1) during the switching cycle can be determined. As long as this difference in amplitude remains constant the RF MEMS device (1) switches properly. Any change in this amplitude difference points to a wear-out of the switching performance. Depending on the material choice the switching action results in a weakening of their mechanical strength and finally no amplitude difference is observed when the RF MEMS switch has finally failed. If the bridge (2) would partially stick to the bottom electrode (3) this would result in a change of the amplitudes $V_a$ and $V_b$ of the modulated second voltage signal $V^*_{meas}$ which will be reflected in the envelope signal. If the response of the switch to the actuation voltage is delayed, e.g. to wear out, the fall time $T_f$ and rise time $T_r$ will vary over time. From this it is clear that information of the amplitude modulated second voltage signal during both the up and down time of the switch is used to study the switching performance.

In another aspect of the invention an apparatus is disclosed to measure the switching characteristics of the micromachined device under test.

Figure 4A:
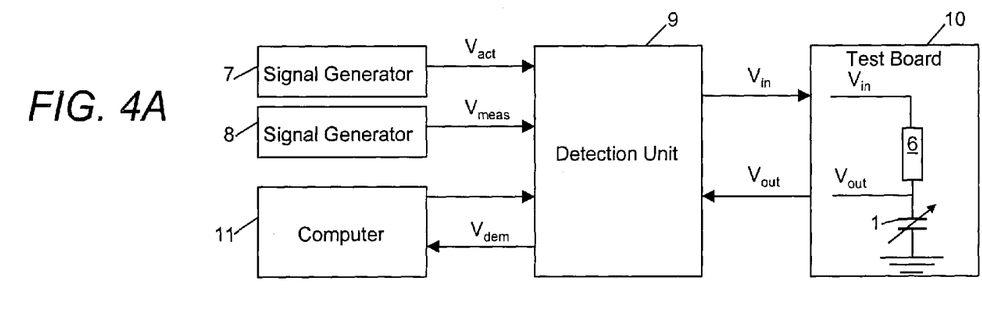
FIGS. 4a–4d illustrate showing a schematic view of the equipment set-up (FIG. 4a) according to another aspect of the invention with details of the detection unit (FIG. 4b), the adder circuit (FIG. 4c) and the envelope detector (FIG. 4d) respectively.

A schematic equipment set-up for the assessment of lifetime tests of micromachined devices comprising movable parts, such as RF MEMS switches is shown in FIG. 4a. The equipment set-up comprises a first generator (7) supplying the first voltage signal or actuation voltage $V_{act}$, a second generator (8) supplying the second voltage signal or measurement signal $V_{meas}$, a computer (11) for controlling the operation of the equipment set-up, a detection unit (9) and a test board (10). The test board comprises the RF MEMS switch (1) configured in a voltage divider arrangement as illustrated in FIGS. 2a and 2b. The detection unit (9) combines the first and the second voltage signal to an input signal $V_{in}$ that is applied to the devices-under-test (1), while the computer (10) selects the device or devices to be tested. The detection unit (9) collects the output signal $V_{out}$ of the device(s) under test and yields the characteristic electrical signal $V_{dem}$ that can be transmitted to the computer (11) for further processing or data storage or acquisition.

Figure 4B:
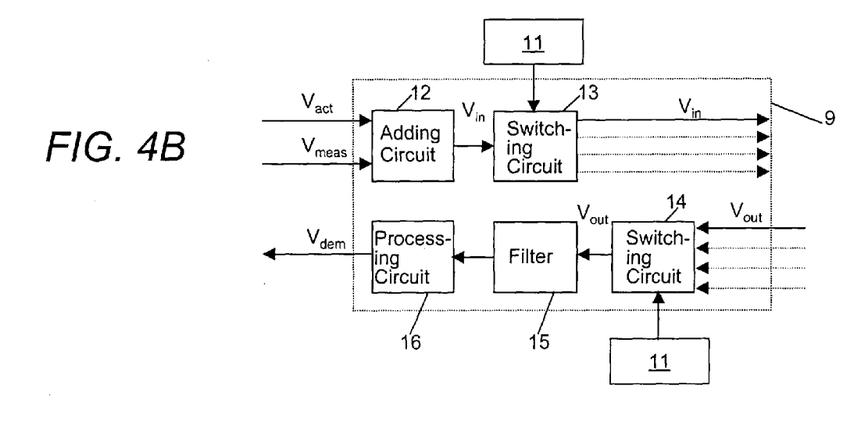

FIG. 4b gives a detailed view of such detection unit (9). The first and second voltage signals are combined e.g. in an adding circuit (12). The combined signal can optionally be amplified and is then supplied to test board (10). If more than 1 device (1) needs to be tested, a first switching matrix (13) is foreseen. Under control of the computer (11) this first switching circuit (13) can select the device or devices on the test board (10) to be tested. More than one device (1) can be tested or monitored in parallel with the others. If needed buffers can be inserted to provide sufficient power to multiplexed signal in order to drive all the devices (1) to be tested simultaneously without degradation of the input signal $V_{in}$, although the use of such buffers has some drawbacks as explained later on. The output signal of the monitored device or devices is sent to the detection unit (9). A second switching matrix (14) is foreseen to collect the output signal of the device or devices that are being tested. The sampled output signals are fed into a filter (15), e.g. a band pass filter, to remove the actuation voltage $V_{act}$ being the low frequency part of the output signal, yielding only the high frequency part $V^*_{meas}$ of the output signal. This high frequency part is then processed in a circuit (16) resulting in an electrical signal $V_{dem}$ related to the switching characteristics of the RF MEMS switch (1). This electrical signal $V_{dem}$ can then be collected by the computer (11). Depending on the set-up multiple devices-under-test (1) can be addressed simultaneously and monitored one-at-a-time or multiple devices-under-test (1) in parallel as is illustrated by the dashed arrows in FIG. 4b.

Figure 4C:
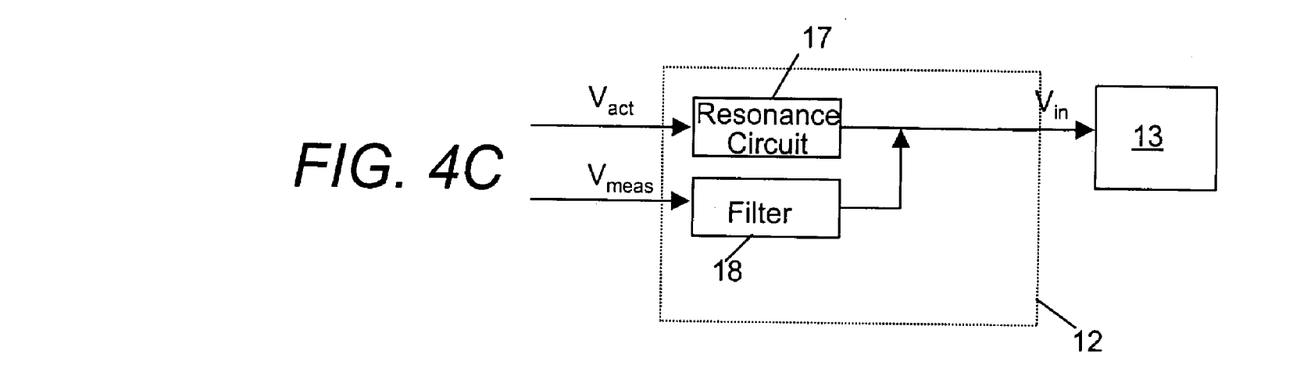
Figure 4D:
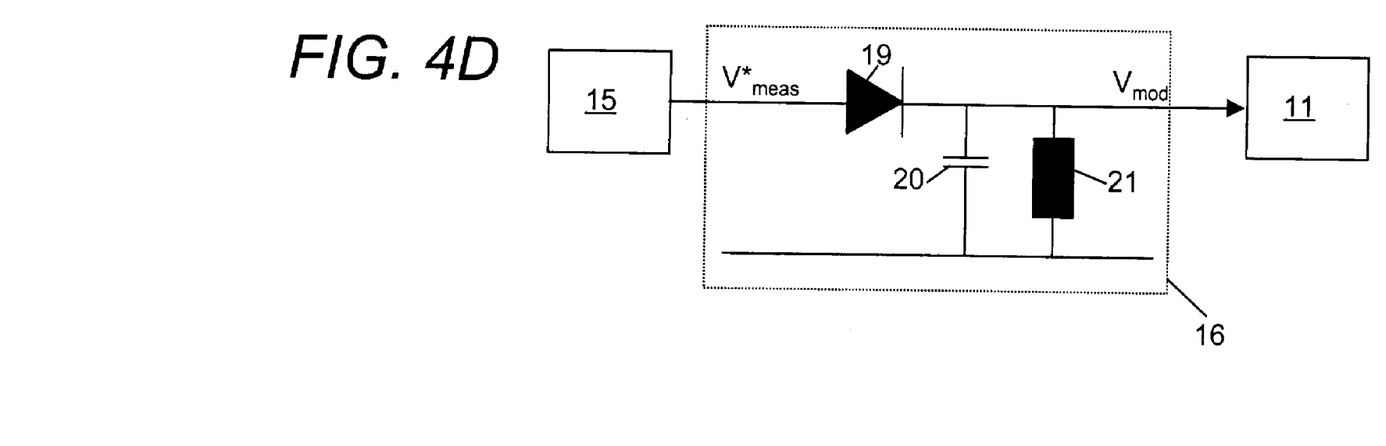

The circuit (16) generating the electrical signal $V_{dem}$ can comprise an amplitude modulation detector. This amplitude modulation detector can be a simple envelope detector of the series type, e.g. comprising a diode (19) and a resistor (21) capacitor (20) filter as illustrated in FIG. 4d, or a more elaborate set-up using a homodyne or heterodyne detector unit with zero intermediate frequency as is known and appreciated by a person skilled in the art. The resulting signal $V_{dem}$ can be considered as the envelope of an amplitude modulated (AM) signal $V^*_{meas}$. The high frequency signal $V_{meas}$ can be considered as the carrier signal of an AM signal, which is much higher in frequency then the lower frequency signal $V_{act}$ which can be considered as the message signal of the amplitude modulated wave.

In another embodiment of the invention, the combining of the first and second voltage signal is outlined. The combined signal $V_{in}$ can be generated in several ways. One way is an adder circuit comprising active components. With active components is meant for example transistors, integrated circuits and alike. These active components can also be used in the adder circuit itself or in the subsequent amplifiers. However these active components inherently introduce non-linearities in the combined and amplified signal $V_{in}$ causing the combined signal to become already somewhat amplitude modulated before supplying the input signal to the switch. To circumvent this problem with active electronics, a different approach is illustrated in FIG. 4c. The low frequency first voltage signal $V_{act}$ passes through a filter i.e. a resonance circuit (17) comprising passive components, e.g. a parallel connection of a capacitor and a coil. This resonance circuit (17) blocks the high frequency second voltage signal $V_{meas}$ coming from the second generator (8). The high frequency second voltage signal $V_{meas}$ also passes trough a filter (18), in this case a ceramic filter, while this filter (18) blocks the high voltage low frequency actuation signal $V_{act}$ coming from the first generator (7). By using these passive components to respectively transmit one signal and block the other signal both signals can be put on the same voltage line without reversely effecting the first and second voltage generators (7,8). The use of passive components such as resistors, capacitors and coils, but ceramic filters are also considered passive because they have no amplifying parts, results in negligible amplitude modulation prior to the switch. Essentially all amplitude modulation measured in the output signal $V_{out}$ stems from the switching action of the RF MEMS switch (1) or phenomena associated with changes in the capacitance of the RF MEMS switch (1) such as e.g. changes in the dielectric on top of the bottom electrode (3).

At the output terminal of the test board (10) or of the switching matrix (14) again a band-pass ceramic filter (15) can be used to block the high voltage actuation voltage, which could destroy or at least interfere with the normal operation of the detector circuit (16). After passing this filter (15) the high frequency modulated signal $V^*_{meas}$ can be optionally amplified using active components.

In one embodiment of the invention the following parameter values are used:

a first voltage signal $V_{act}$ was a square wave with a low level $V_l$ of 0 V and a high level $V_h$ of 50V with an actuation frequency of 1 kHz and a duty cycle of 50%. The first position of the bridge (2) is being open and at maximum distance from the bottom electrode (3) while the second position of the switch is closed and in direct contact with the bottom electrode (3).

A second voltage signal $V_{meas}$ was a sinus wave with a frequency of 10.7 MHz and an amplitude of 1V.

The change in impedance value for the variable impedance $Z_c$ of the RF MEMS switch (1) at 10 MHz was between 0.1 pF and 10 pF.

16 RF MEMS switches (1) can be put on the same test board and they can be selectively tested under control of the computer The devices under test (1) were switched in a logarithmic order and the testing was done automatically after 10, 20, 50, 100, 200, . . . cycles upto 20 $10^8$ cycles which corresponds to a total test time of 5.8 days.

devices were tested at room temperature or at 125° C.

Figure 5A:
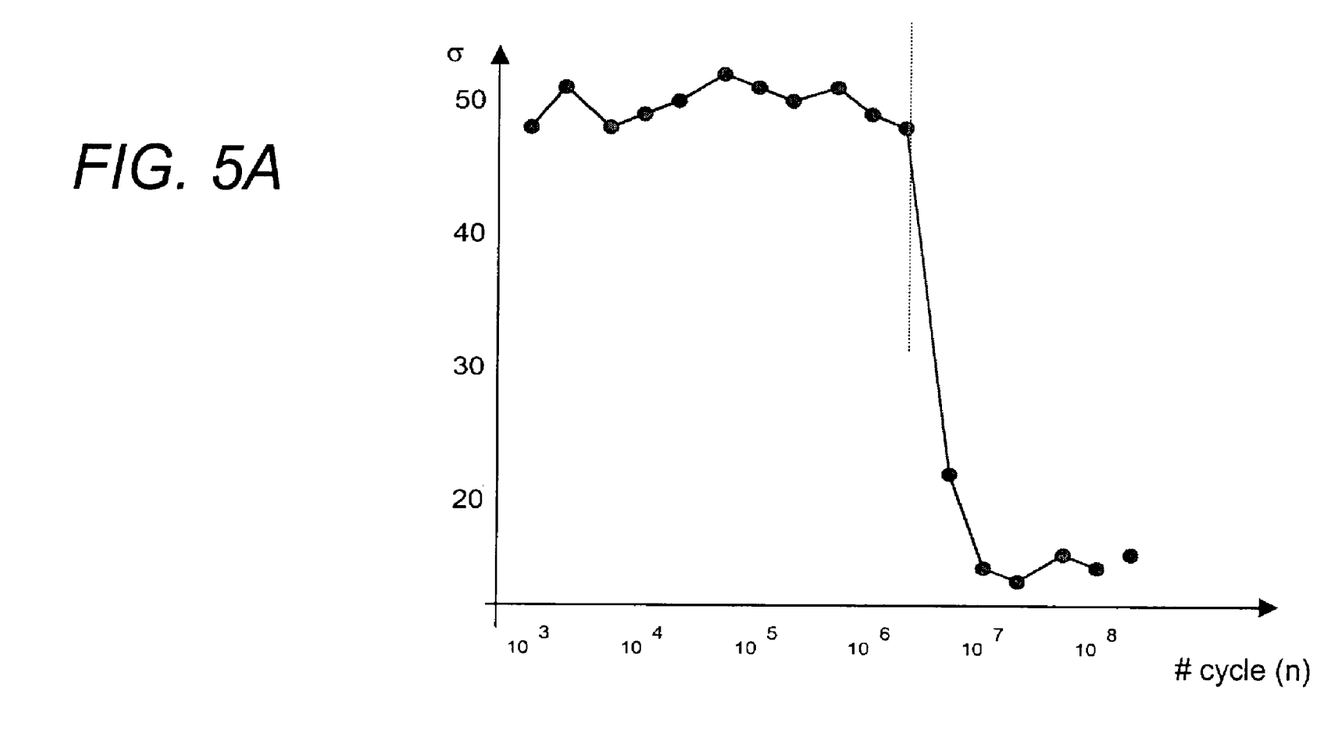
FIGS. 5a and 5b illustrate examples of two characteristic signals according to another aspect of the invention.
Figure 5B:
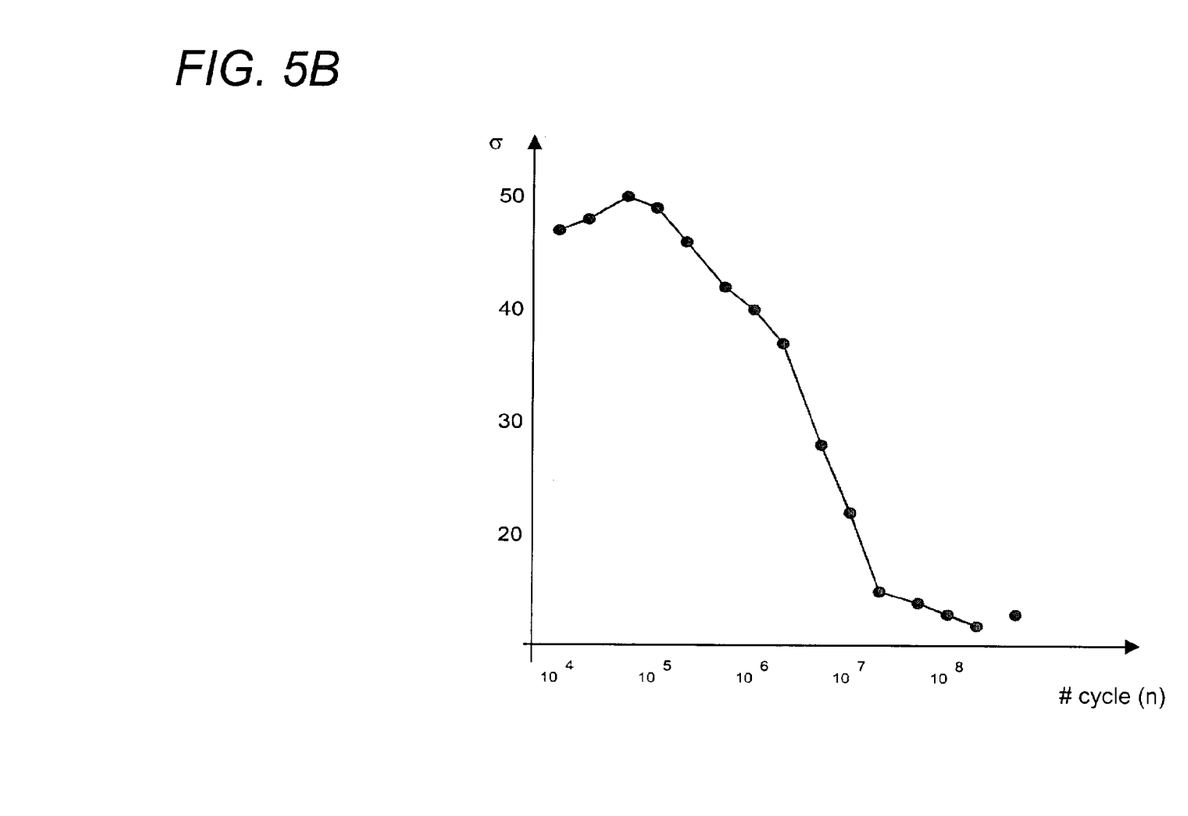

FIGS. 5a and 5b are examples of such an envelope signal. On the horizontal axis the number "n" of switching cycles is given on a logarithmic scale, while on the vertical axis the standard deviation on the amplitude of the detector signal $V^*_{meas}$ is given, instead of the amplitude or difference ($\Delta V$) itself. FIG. 5a shows the performance of a good switch that can be activated about $2 \cdot 10^6$ times before starting to fail, as indicated by the sudden decrease in signal. FIG. 5b shows the performance of a bad device, that already starts to fail from $10^5$ cycles on as indicated by the gradually decrease of the signal with increased switching actions.

What is claimed is:

1. An apparatus for determining the performance of at least one micromachined or microelectromechanical systems device (MEMS device) intended to carry a high frequency signal having an intended working frequency, the device comprising a capacitive structure with at least one movable part, the apparatus comprising:
   means for providing a voltage signal;
   at least one voltage divider circuit comprising, in series with the means for providing the voltage signal, an impedance, an outlet and the capacitive structure; and
   means for detecting and measuring the voltage at the outlet of the voltage divider,
   wherein the means for providing the voltage signal is arranged for providing a combined voltage signal of an actuation voltage able to act on the moveable part of the capacitive structure with an actuation frequency and of a measurement voltage, the measurement voltage having a measurement frequency lower than the intended working frequency.

2. An apparatus according to claim 1, wherein the actuation frequency is in the range of 1 Hz to 200 kHz.

3. An apparatus according to claim 1, wherein the MEMS device comprises an RF MEMS switch with the intended working frequency in a frequency range of 100 MHz to 100 GHz.

4. An apparatus according to claim 3, wherein the intended working frequency is in a frequency range of 100 MHz to 10 GHz.

5. An apparatus according to claim 3, wherein the measurement frequency is substantially below the signal frequency of the signals passing through or transmitted by the RF MEMS switch during operation.

6. An apparatus according to claim 1, wherein the measurement frequency is in a frequency range of 1 MHz to 50 MHz.

7. An apparatus according to claim 6, wherein the measurement frequency is in a frequency range of 1 MHz to 10 MHz.

8. An apparatus according to claim 6, wherein the measurement frequency is in a frequency range of 10 MHz to 20 MHz.

9. An apparatus according to claim 1, wherein the movable part comprises at least two movable elements which move between two extreme positions, and wherein the extreme positions are indicative of two predetermined values.

10. An apparatus according to claim 1, wherein a series of voltage divider circuits are arranged in an array with a series of capacitive structure.

11. An apparatus according to claim 10, further comprising means for digitally selecting at least one voltage divider circuit from the array of voltage divider circuits.

12. An apparatus according to claim 11, wherein the means for digitally selecting the at least one voltage divider circuit includes means for selecting at least two of the voltage divider circuits simultaneously from the array of voltage divider circuits.

13. A method of determining the performance of at least one micromachined or microelectromechanical systems device (MEMS device), capable of carrying a high frequency signal having an intended working frequency, and comprising a capacitive structure with at least one movable part, comprising:
   providing a voltage signal;
   applying the voltage signal to at least one voltage divider circuit comprising, an impedance, an outlet and the capacitive structure; and
   detecting and measuring the voltage at the outlet of the voltage divider;
   wherein the voltage signal is a combined voltage signal of an actuation voltage able to act on the moveable part of the capacity structure with an actuation frequency and a measurement voltage, the measurement voltage having a measurement frequency lower than the intended working frequency.

14. A method according to claim 13, wherein the voltage signal is applied in series to the at least one voltage divider circuit.

15. A method according to claim 13, wherein the detecting and measuring comprises analyzing the envelope of the amplitude modulated measurement voltage at the outlet of the voltage divider.

16. A method according to claim 13, wherein the actuation voltage has an actuation frequency in the range of 1 Hz to 200 kHz.

17. A method according to claim 13, wherein the MEMS device comprises a RF MEMS switch and the intended working frequency is in a frequency range of 100 MHz to 100 GHz.

18. A method according to claim 13, wherein the intended working frequency is in a frequency range of 100 MHz to 10 GHz.

19. A method according to claim 13, wherein the measurement frequency is in a frequency range of 1 MHz to 50 MHz.

20. A method according to claim 19, wherein the measurement frequency is in a frequency range of 1 MHz to 10 MHz.

21. A method according to claim 13, wherein the movable part comprises at least two movable elements which move between two extreme positions, wherein the extreme positions are indicative of two predetermined values.

22. An apparatus for determining the performance of at least one micromachined or microelectromechanical systems device (MEMS device) intended to carry a high frequency signal having an intended working frequency, the device comprising a capacitive structure with at least one movable part, the apparatus comprising:
   a voltage signal source;
   at least one voltage divider circuit comprising, in series with the voltage signal source, an impedance, an outlet and the capacitive structure; and
   a detection unit configured to detect and measure the voltage at the outlet of the voltage divider;
   wherein the detection unit is configured to provide a combined voltage signal of an actuation voltage able to act on the moveable part of the capacitive structure with an actuation frequency and of a measurement voltage, the measurement voltage having a measurement frequency lower than the intended working frequency.

23. An apparatus according to claim 22, wherein the MEMS device comprises a RF MEMS switch.

24. An apparatus according to claim 22, wherein the actuation frequency signal comprises a block wave, square wave or single pulse wave, with a duty cycle of about 50%.

25. An apparatus according to claim 22, wherein the actuation frequency is in the range of 1 Hz to 200 kHz.

26. An apparatus according to claim 22, wherein the measurement frequency is about 100 times higher than actuation frequency.

27. An apparatus according to claim 22, wherein the measurement frequency comprises a periodic signal.

28. An apparatus according to claim 27, wherein the periodic signal comprises a (co)sinusoidal, triangular wave or sawtooth wave.

29. An apparatus according to claim 27, wherein the amplitude of the measurement voltage is in the range of 100 mv to 2V.

30. A test system for a micromachined or microelectromechanical systems (MEMS) device, comprising:
   a detection unit having inputs for an actuation signal, a measurement signal, and a MEMS output signal, and having ouputs for a MEMS input signal and a test result signal; and
   a test unit configured to feed the received MEMS input signal to a voltage divider circuit connectable to a MEMS device, and to feed the MEMS output signal to the detection unit, wherein the detection unit includes a signal combiner, which inputs the actuation and measurement signals, and outputs the MEMS input signal.

31. The test system of claim 30, additionally comprising a plurality of signal generators which output the actuation and measurement signals to the detection unit, and a computer for controlling the detection unit.

32. The test system of claim 31, wherein the plurality of signal generators comprise a first signal generator configured to provide the actuation signal and a second signal generator configured to provide the measurement signal.

33. The test system of claim 30, wherein the detection unit selectively switches the MEMS input and MEMS output signals to an array of MEMS devices.

34. The test system of claim 30, wherein the detection unit comprises:
   a combiner configured to combine the actuation and measurement signals;
   first and second switching circuits configured to selectively switch the MEMS input and MEMS output signals to an array of MEMS devices, respectively;
   a filter configured to remove portions of the MEMS output signal; and
   a processing circuit configured to input the filtered MEMS output signal and output the test result signal.

35. The test system of claim 30, wherein the detection unit includes a filter configured to remove portions of the MEMS output signal.

36. The test system of claim 35, wherein the detection unit additionally comprises a processing circuit configured to input the filtered MEMS output signal and output the test result signal.

37. The test system of claim 36, wherein the processing circuit comprises an amplitude modulation detector.

38. The test system of claim 37, wherein the amplitude modulation detector comprises a series type envelope detector.

39. A test system for a micromachined or microelectromechanical systems (MEMS) device configured to transmit high frequency signals, comprising:
   a voltage signal source,
   at least one voltage divider circuit, connected in series with the voltage signal source, and being connectable to a MEMS device; and
   a detection unit configured to detect and measure the voltage output by the voltage divider;
   wherein the detection unit is configured to provide a combined voltage signal of an actuation voltage capable of the actuating the MEMS and of a measurement voltage, wherein the measurement voltage has a frequency lower than the frequency of the high frequency signal.

* * * * *

UNITED STATES PATENT AND TRADEMARK OFFICE
CERTIFICATE OF CORRECTION

PATENT NO. : 6,998,851 B2
APPLICATION NO. : 10/448734
DATED : February 14, 2006
INVENTOR(S) : Willem Van Spengen It is certified that error appears in the above-identified patent and that said Letters Patent is hereby corrected as shown below:

On Page 1, Item (56) References Cited, Column 2 under Other Publications, Line 2, Delete "MIT-S" and insert --MTT-S--, therefor.

On Page 1, Item (56) References Cited, Column 2, under Other Publications, Line 2, After "(2001)" insert --,--.

In Column 1, Line 33, Delete "designated" and insert --designates--, therefor.

In Column 2, Line 7, Delete "pp" and insert --pp.--, therefor.

In Column 2, Line 10-11, Delete "5 $10^8$" and insert --5 x $10^8$--, therefor.

In Column 3, Line 44, After "voltage" insert --.--.

In Column 6, Line 31, Delete ""$V_{out}$," and insert --$V_{out}$--, therefor.

In Column 7, Line 15, Delete "1 kHz" and insert --1 Hz--, therefor.

In Column 9, Line 59-60, Delete "resistor (21) capacitor (20)" and insert --resistor (21)-capacitor (20)--, therefor.

In Column 10, Line 65, Delete "20 $10^8$" and insert --20 x $10^8$--, therefor.

In Column 11, Line 7, Delete "2 $10^6$" and insert --2 x $10^6$--, therefor.

In Column 12, Line 18, delete "capacity" and insert --capacitive--, therefor.

In Column 13, Line 18, delete "mv" and insert --mV--, therefor.

UNITED STATES PATENT AND TRADEMARK OFFICE
CERTIFICATE OF CORRECTION

PATENT NO.         : 6,998,851 B2
APPLICATION NO. : 10/448734
DATED              : February 14, 2006
INVENTOR(S)        : Willem Van Spengen It is certified that error appears in the above-identified patent and that said Letters Patent is hereby corrected as shown below:

In Column 13, Line 23, delete "ouputs" and insert --outputs--, therefor.

Signed and Sealed this

Twenty-fourth Day of October, 2006

JON W. DUDAS
*Director of the United States Patent and Trademark Office*